United States Patent [19]

Carley et al.

[11] Patent Number: 4,496,812
[45] Date of Patent: Jan. 29, 1985

[54] MEMBRANE PANEL

[75] Inventors: Joseph L. Carley; James S. Potter, both of Millville; Anthony A. Ciccotelli, Eldora, all of N.J.

[73] Assignee: Duralith Corporation, Millville, N.J.

[21] Appl. No.: 456,242

[22] Filed: Jan. 6, 1983

[51] Int. Cl.³ .............................................. H01H 13/70
[52] U.S. Cl. ............................... 200/159 B; 200/5 A; 200/314; 200/292
[58] Field of Search .................... 200/314, 159 B, 310, 200/313, 5 A

[56] References Cited

U.S. PATENT DOCUMENTS 4,284,866 8/1981 Bryce et al. ..................... 200/159 B Primary Examiner—Stephen Marcus
Assistant Examiner—Ernest G. Cusick
Attorney, Agent, or Firm—Lahive & Cockfield

[57] ABSTRACT

A membrane panel including at least one electrical component. The panel includes a rigid support member having substantially planar top and bottom surfaces. At least one void region, or hole, extends from the bottom surface of that support member. A flexible top member including at least one flexible layer, overlies the support member. A flexible bottom member including at least one flexible layer underlies the support member. The bottom member has its upper surface affixed to the bottom surface of the support member. Further, the bottom member includes an integral flexible tail. The bottom member includes at least one electrical component affixed to its upper surface with that component underlying and extending into an associated one of the void regions of the support member. An electrically conductive pattern is affixed to the upper surface of the bottom member and that pattern is electrically coupled to the component to permit its operation in an electrical network.

6 Claims, 6 Drawing Figures

4,496,812

MEMBRANE PANEL

REFERENCE TO RELATED PATENT APPLICATION

The subject matter of this application is related to that of U.S. patent application Ser. No. 407,627, entitled "Flexible Electric Circuit", filed Aug. 12, 1982 and assigned to the assignee of the present invention. The latter application is incorporated herein by reference.

BACKGROUND OF THE DISCLOSURE

The present invention relates to instrumentation, and more particularly, to improvements in membrane panels for instruments.

Laminated graphic plastic control panel assemblies are often utilized in instruments in the electronic test equipment, bio-medical, computer, telecommunication and machine tool, and other industries. Such assemblies often include membrane switches which are responsive to external forces to provide an electrically conductive coupling between two terminals. Typically, the switch includes three stacked flexible layers in the panel, where the opposing surfaces of the outer layers include conductive patterns which include overlapping portions and the middle layer includes a void region between the overlapping portions. Conventional membrane panel assemblies, with or without switches, typically include graphic plastic overlays which are bonded to membrane switches which are, in turn, bonded to a rigid sub-panel.

In the prior art, the known panel assemblies are passive, including no electronic circuitry other than conductive patterns, but are often adapted to interface with electronic circuitry. Often, the panel assemblies include light transmissive regions, such as holes, which are adapted for placement over an external light source to provide an illuminated display.

However, all such external circuitry and light sources place restrictions on the utilization of such panel assemblies, in terms of positioning (for example, with respect to an external light source) in the instrument to which the panel assembly is attached. Moreover, the various circuitry for the functions must necessarily be remote from the panel itself.

Accordingly, it is an object of the present invention to provide an active membrane panel.

It is another object to provide a membrane panel which includes integral electronic components.

Another object is to provide a membrane panel having integral illuminating means.

SUMMARY OF THE INVENTION

Briefly, the present invention is directed to active membrane panels for instruments. The panel includes a rigid support member having substantially planar top and bottom surfaces. At least one void region, or hole, extends from the bottom surface of that support member. A flexible top member including at least one flexible layer, overlies the support member. A flexible bottom member including at least one flexible layer underlies the support member. The bottom member has its upper surface affixed to the bottom surface of the support member. Further, the bottom member includes an integral flexible tail. The bottom member includes at least one electrical component affixed to its upper surface with that component underlying and extending into an associated one of the void regions of the support member. An electrically conductive pattern is affixed to the upper surface of the bottom member and that pattern is electrically coupled to the component to permit its operation in an electrical network.

With this configuration, a compact membrane panel is provided which includes integral electrical components. In various forms of the invention, a membrane type switches may be provided within the top member. The electrical component may have the form of a light emitting diode (LED), or may include other types of components, such as integrated circuit chips. In the latter type configurations in particular, the bottom member may include one or more flexible layers, where one or more of those flexible layers may include two-sided conductive patterns.

In yet another form of the invention, an assembly is provided whereby the support member and bottom member may be selectively inserted or removed from a housing formed by the top member, an additional spacer member and base member.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
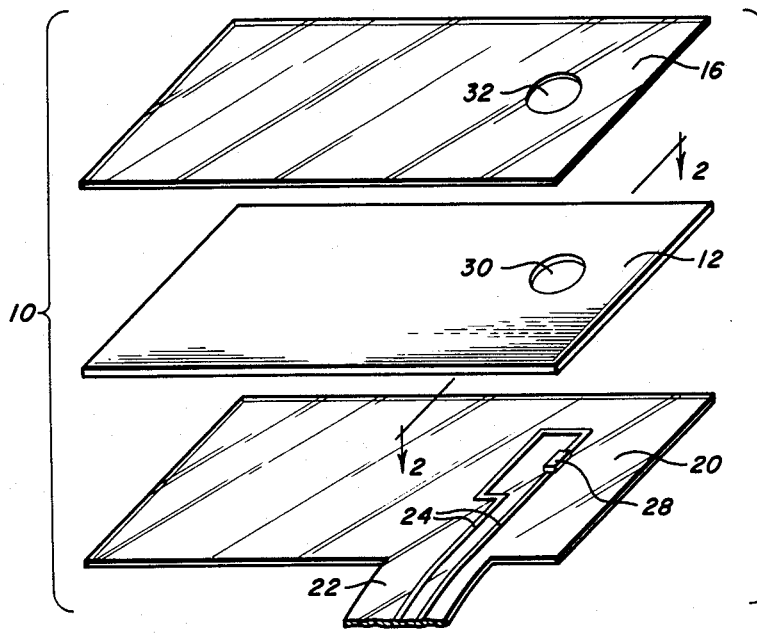
FIG. 1 shows in an exploded view an exemplary membrane panel embodying the present invention.

FIG. 1 shows in exploded form an upper membrane panel 10 embodying the present invention. Panel 10 includes a rigid support member 12 (for example made of polycarbonate) having substantially planar top and bottom surfaces. The support member 12 includes a single void region extending from its bottom surface. As shown in the sectional view of support member 12 in FIG. 2, the void region denoted by reference designation 12a is a hole passing from the bottom to top surfaces of member 12. In alternative embodiments, there may be more than one void region.

Figure 3:
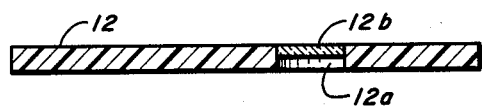
FIG. 3 shows a sectional view of a portion of an alternative form of membrane panel.

FIG. 3 shows a sectional view of the support member 12 an alternative embodiment of the invention, where the void region 12a extends from the lower surface of member 12 and only partially through that member. In the embodiment of FIG. 3, the void region is terminated by a light transmissive region 12b.

In the embodiment of FIG. 1, a flexible top member 16 is affixed to the top surface of support member 12. In the form of the invention illustrated in FIG. 1, this top member 16 is a flexible layer, for example, made of mylar.

A flexible bottom member 20 is affixed to the lower surface of the support member 12. The bottom member 20 is a flexible layer, for example, made of mylar, which includes an integral flexible tail 22 extending from one edge. The bottom member includes an electrically conductive pattern 24 affixed to its upper surface. An electrical component 28 is mounted directly on the top surface of bottom member 24 at a point underlying the void region 12a of member 12. The component 28, for example, a light emitting diode (LED), is both mechanically and electrically coupled to the conductive pattern 24, for example by way of a conductive epoxy.

With this configuration, a compact membrane panel assembly is provided having an integral electrical component which may be selectively controlled by way of the conductive pattern by the application signals to the conductive pattern 24 from external electronic circuitry. It will be understood that in the present embodiment, in which the electrical component 28 is an LED, both the support member 12 and the top member 16 include light transmissive regions 30 and 32, respectively, which overlie the LED to permit viewing of the illuminated LED by an observer facing the top member 16. It will be further understood that additional components, such as LEDs or other electrical components, may be similarly positioned on the upper surface of member 20 and coupled to extensions of the conductive pattern 24, with each of the components extending at least partially into associated void regions in the support member 12. In some forms of the invention, component 28 may have the form of integrated circuits. In the latter form, the conductive pattern may be on both sides of the flexible layer forming bottom member 20, for example, by using the techniques of the incorporated reference to provide electrical coupling of signals between conductive patterns on the opposite sides of a flexible layer.

Figure 3A:
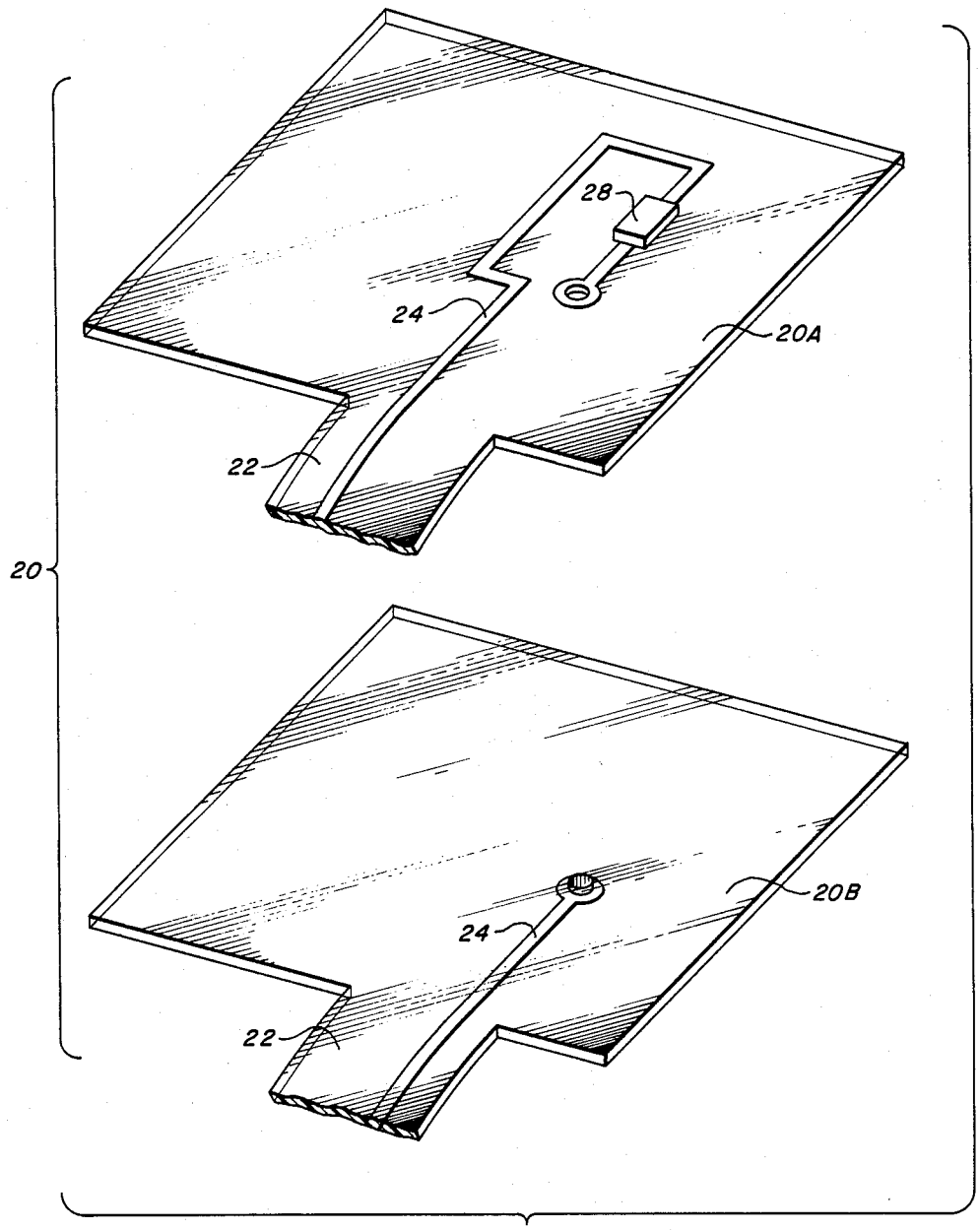
FIG. 3A shows the bottom layer of another exemplary embodiment.

In yet other embodiments, the bottom member 20 may include a plurality of flexible layers (as shown in FIG. 3A), each of which have conductive portions which may be coupled to the various electrical components on the upper surface of the bottom member 20 using inter-layer conductive path of the type shown in the incorporated reference.

In still another form of the invention, the top member may have the form of a membrane switch. In such a configuration, the top member may include at least upper, middle and lower flexible layers (for example, made of mylar) successively stacked on the top surface of the support member. In that configuration, at least one of the upper and lower layers includes an integral flexible tail extending therefrom. Furthermore, each of the upper and lower layers include conductive patterns on their surfaces which are adjacent to the middle layer. The conductive patterns include at least one pair of overlapping portions which lie over a void region in the middle layer. With this configuration, by placing an external force on the upper layer towards the lower layer, the conductive pattern of the upper layer will move towards that of the lower layer, and when those conductive portions come in contact, an electrical connection is made between the corresponding conductive patterns.

Figure 4:
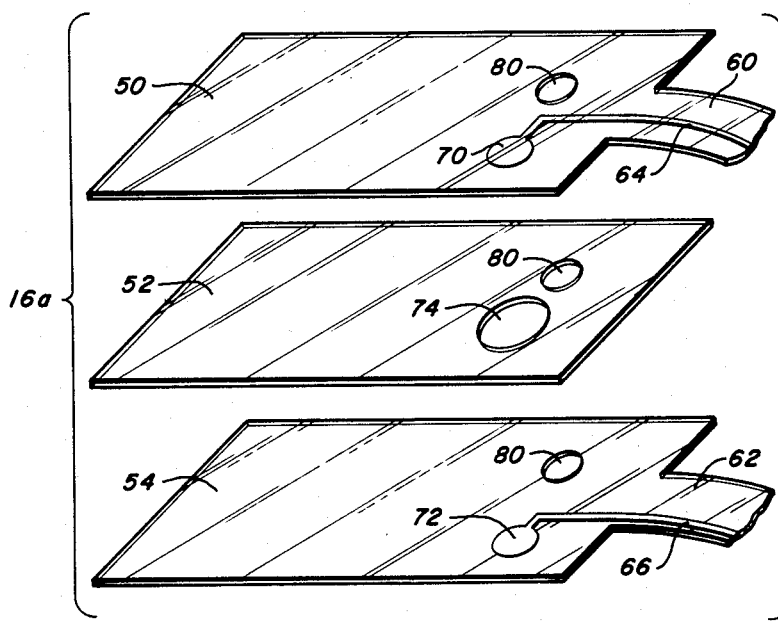
FIG. 4 shows in an exploded view an alternate top member for the membrane panel of FIG. 1.

FIG. 4 shows an exemplary three-layer configuration 16a for top member (incorporating a membrane switch) which may be substituted for the top member 16 shown in the configuration of FIG. 1.

In FIG. 4, the upper layer, middle and lower layers are denoted by reference designations 50, 52 and 54, respectively. Both the layers 50 and 54 have extension portions from their edge (60 and 62) which form a flexible tail which is integral with the switch. The layer 50 has a conductive pattern 64 on its underside and the flexible layer 54 has a conductive pattern 66 on its top surface. The conductive patterns 64 and 66 have a pair of overlapping portions 70 and 72, which lie on either side of a void region 74 in the middle layer 52. Each of layers 50, 52 and 54 are illustrated with light transmissive regions 80 (which are adapted to overlie the LED 28 when the top member 16a is substituted in place of top member 16 in the configuration of FIG. 1.

Generally, with the substitute top member 16a, the membrane panel of FIG. 1 provides a panel which includes a membrane switch as well as an integral electrical component (e.g. an LED as in the illustrated form).

Figure 5:
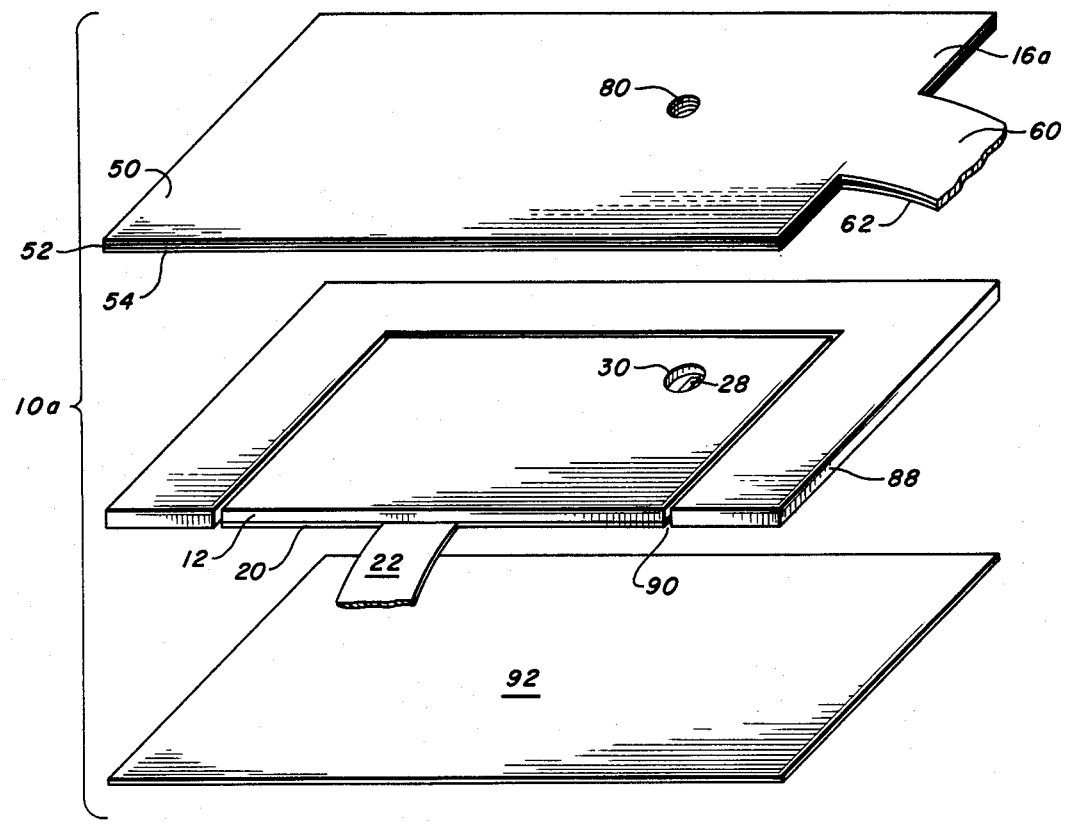
FIG. 5 shows in an exploded view another exemplary embodiment of the present invention.

In yet another embodiment of the present invention, the top member 16 is not affixed to top surface of the support member 12. Such a configuration is shown in FIG. 5 in which similar elements are denoted by the same reference designations used in the previously described configurations. In FIG. 5, top member 16a extends over an area larger than that of the joined support member 12 and bottom member 20.

The membrane panel assembly 10a shown in FIG. 5 includes a support member 12 and bottom member 20. In FIG. 5 these elements are shown in the assembled or joined, position, with a tail 22 extending therefrom. The top member 16a of the configuration of FIG. 5 (shown in assembled configuration) is substantially similar to that of 16a shown in FIG. 4, except that the three layers 50, 52 and 54 extend beyond the edges of the joined support member 12 and bottom layer 20, and include a tail made up of portions 60 and 62, as in FIG. 4. The conductive patterns 64, 66 and 24 are not shown in FIG. 5. The membrane panel 10a further includes a rigid spacer member 88, for example made of polycarbonate, which includes a void region 90 extending from one edge. The top surface of spacer member 88 is affixed to the lower surface of layer 54 of top member 16a. A base member 92, for example made of polycarbonate, is affixed to the lower surface of spacer member 88, and underlies the void region 90 defined by member 88. The void region 90 is shaped to permit the selective invention and removal of the support joined support member 12 and bottom member 20.

Figure 2:
FIG. 2 shows a sectional view of a portion of the panel of FIG. 1.

The carrier portion (members 12 and 20) may include one or more active electrical components mounted on the top surface of the bottom member 20, such as LEDs or integrated circuits, for example, as described above in connection with the configuration of FIGS. 1–3. With this configuration, a compact active membrane panel assembly is provided wherein a readily removable carrier portion (members 12 and 20) may be selectively changed in the event of burn-out or other malfunction of the components in those elements. As shown, the entire panel assembly 10a includes the membrane switch assembly integral with top member 16a.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:

1. A membrane panel comprising:
    A. a rigid support member having substantially planar top and bottom surfaces, and including at least one void region extending from said bottom surface, B. A flexible top member including at least one flexible layer overlaying said support member, and C. a flexible bottom member including a flexible layer underlying said support member and said bottom member having its upper surface affixed to the bottom surface of said support member, and said bottom member including an integral flexible tail extending therefrom, wherein said bottom member further includes at least one electrical component affixed to said upper surface, said component underlying and extending into an associated one of said void regions, and wherein said bottom member further includes an electrically conductive pattern affixed to said upper surface and means for electrically coupling said pattern to said components and further comprising:

a rigid spacer member having its top surface affixed to the underside of said top member, said spacer member including a void region extending from one edge thereof and underlying said top member, a base member affixed to the lower surface of said spacer member and underlying the void region defined by said spacer member, wherein said void region defined by said spacer member has a shape adapted to permit said support member and bottom members to be selectively inserted therein and withdrawn therefrom.

2. A membrane panel according to claim 1 wherein at least one of said components is a light emitting diode (LED) and wherein the layers of said top member and said support member include a light transmissive region overlying said LED.

3. A membrane panel according to claim 2 wherein said bottom member includes a plurality of flexible layers, wherein at least two or said layers include conductive patterns affixed to their surfaces, and further includes means for electrically coupling said pattern to said component.

4. A membrane panel according to claim 2 wherein the light transmissive regions of said top and support members are aligned when said support member is fully inserted into the void region of said spacer member.

5. A membrane panel according to claim 1 wherein said top member includes at least upper, middle and lower flexible layers successively stacked on said top surface of said support member, wherein said at least one of said upper and lower layers includes an integral flexible tail extending therefrom, wherein said upper and lower layers include conductive patterns on their surfaces adjacent to said middle layer, said patterns including at least one pair of overlapping portions, and wherein said middle layer includes a void region between the overlapping portions of at least one of said pairs.

6. A membrane panel according to claim 1 wherein said bottom member includes a plurality of flexible layers, wherein at least two or said layers include conductive patterns affixed to their surfaces, and further includes means for electrically coupling said pattern to said component.

* * * * *